(12) United States Patent
Gregori et al.

(10) Patent No.: US 7,047,478 B2
(45) Date of Patent: May 16, 2006

(54) MULTIPURPOSE METHOD FOR CONSTRUCTING AN ERROR-CONTROL CODE FOR MULTILEVEL MEMORY CELLS OPERATING WITH A VARIABLE NUMBER OF STORAGE LEVELS, AND MULTIPURPOSE ERROR-CONTROL METHOD USING SAID ERROR-CONTROL CODE

(75) Inventors: Stefano Gregori, Torre d'Isola (IT); Pietro Ferrari, Varese (IT); Guido Torelli, Sant'Alessio con Vialone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 331 days.

(21) Appl. No.: 10/015,949

(22) Filed: Nov. 2, 2001

(65) Prior Publication Data

US 2002/0157059 A1 Oct. 24, 2002

(30) Foreign Application Priority Data

Nov. 7, 2000 (IT) .......................... TO2000A1049

(51) Int. Cl.
*G11C 29/00* (2006.01)
*H03M 13/00* (2006.01)

(52) U.S. Cl. ...................................... 714/773; 714/784

(58) Field of Classification Search ................ 714/784, 714/763, 764, 773
See application file for complete search history.

(56) References Cited

U.S. PATENT DOCUMENTS

| 5,574,879 | A | 11/1996 | Wells et al. ................ 395/427 |
| 5,754,566 | A | 5/1998 | Christopherson et al. ........................ 371/40.18 |
| 6,233,717 | B1 * | 5/2001 | Choi ........................... 714/805 |
| 6,378,104 | B1 * | 4/2002 | Okita .......................... 714/784 |

* cited by examiner

*Primary Examiner*—Joseph D. Torres
(74) *Attorney, Agent, or Firm*—Lisa K. Jorgenson; Robert Iannucci; Seed IP Law Group PLLC

(57) ABSTRACT

Described is an error control method for multilevel memory cells operating with a variable number of storage levels. The method includes: receiving a first information word having k input symbols each in a first base; converting the first information word into a second base by converting the input symbols into input symbols in the second base; encoding the converted first information word into a first codeword having k+n coded symbols in the second base; and writing the first codeword into the multilevel memory cells. The encoding step may include generating a generating matrix and multiplying the first information word by the generating matrix to produce the first codeword.

20 Claims, 6 Drawing Sheets

| Exponential notation | Quaternary polynomial notation | Binary polynomial notation of GF(16) on GF(2) | Hexadecimal notation |
|---|---|---|---|
| 0 | 0 | 0 | 0 |
| $\alpha^0$ | 1 | 1 | 1 |
| $\alpha^1$ | $X$ | $x$ | 2 |
| $\alpha^2$ | $x+2$ | $x^2$ | 4 |
| $\alpha^3$ | $3x+2$ | $x^3$ | 8 |
| $\alpha^4$ | $x+1$ | $x+1$ | 3 |
| $\alpha^5$ | 2 | $x^2+x$ | 6 |
| $\alpha^6$ | $2x$ | $x^3+x^2$ | C |
| $\alpha^7$ | $2x+3$ | $x^3+x+1$ | B |
| $\alpha^8$ | $x+3$ | $x^2+1$ | 5 |
| $\alpha^9$ | $2x+2$ | $x^3+x$ | A |
| $\alpha^{10}$ | 3 | $x^2+x+1$ | 7 |
| $\alpha^{11}$ | $3x$ | $X^3+x^2+x$ | E |
| $\alpha^{12}$ | $3x+1$ | $x^3+x^2+x+1$ | F |
| $\alpha^{13}$ | $2x+1$ | $X^3+x^2+1$ | D |
| $\alpha^{14}$ | $3x+3$ | $x^3+1$ | 9 |

Table I

Fig. 1

| Exponential notation | Binary polynomial notation of GF(4) on GF(2) | Quaternary notation |
|---|---|---|
| 0 | 0 | 0 |
| $\alpha^0$ | 1 | 1 |
| $\alpha^1$ | $X$ | 2 |
| $\alpha^2$ | $X+1$ | 3 |

Table II

Fig. 2

| Exponential notation | Quaternary polynomial notation | Binary polynomial notation | Hexadecimal notation |
|---|---|---|---|
| 0 | 0 | 0 | 0 |
| $\alpha^0$ | 1 | 1 | 1 |
| $\alpha^1$ | $X$ | $x$ | 2 |
| $\alpha^2$ | $X+2$ | $x^2$ | 4 |
| $\alpha^3$ | $3x+2$ | $x^3$ | 8 |
| $\alpha^4$ | $X+1$ | $x^3+1$ | 9 |
| $\alpha^5$ | 2 | $x^3+x+1$ | B |
| $\alpha^6$ | $2x$ | $x^3+x^2+x+1$ | F |
| $\alpha^7$ | $2x+3$ | $x^2+x+1$ | 7 |
| $\alpha^8$ | $X+3$ | $x^3+x^2+x$ | E |
| $\alpha^9$ | $2x+2$ | $x^2+1$ | 5 |
| $\alpha^{10}$ | 3 | $x^3+x$ | A |
| $\alpha^{11}$ | $3x$ | $x^3+x^2+1$ | D |
| $\alpha^{12}$ | $3x+1$ | $x+1$ | 3 |
| $\alpha^{13}$ | $2x+1$ | $x^2+x$ | 6 |
| $\alpha^{14}$ | $3x+3$ | $x^3+x^2$ | C |

Table III

Fig. 3

MULTIPURPOSE METHOD FOR CONSTRUCTING AN ERROR-CONTROL CODE FOR MULTILEVEL MEMORY CELLS OPERATING WITH A VARIABLE NUMBER OF STORAGE LEVELS, AND MULTIPURPOSE ERROR-CONTROL METHOD USING SAID ERROR-CONTROL CODE

BACKGROUND OF THE INVENTION

1. Field of the Invention

The present invention relates to a method for constructing a multipurpose error-control code for multilevel memory cells operating with a variable number of storage levels, and to a multipurpose error-control method using said error-control code.

In particular, the present invention regards the definition of error-control codes for multilevel semiconductor memories and, more precisely, the definition of multipurpose linear block codes that enable error detection and correction in multilevel memories, maintaining the functionality thereof with memory cells operating with a different number of storage levels.

2. Description of the Related Art

As is known, thanks to the evolution of technological processes that make it possible to manufacture elementary devices of ever smaller dimensions, in the last few years semiconductor memories have been produced that have very high storage capacities.

A further increase in storage capacity has been achieved by resorting to multilevel storage, which makes it possible to increase the storage density, given the same technological generation. In fact, with this technique a number of information bits are stored within the individual memory cell normally used for storing a single bit.

It is moreover known that, in order to read a two-level memory cell (storing 1 bit), an appropriate electric quantity, linked to the state of the cell, is compared with a reference value, and, according to the outcome of the comparison, it may be determined whether the memory cell contains a logic "0" or a logic "1".

In the case of cells that are able to store r bits, reading is carried out by comparing the electric quantity correlated to the state of the cell with $2^r-1$ reference levels. The outcome of the comparisons enables determination in which of the $2^r$ intervals allowed the cell is found, and consequently reconstruction of content of the cell in terms of binary information.

The multilevel approach can be applied both to volatile memories (such as DRAM memories) and to nonvolatile memories (such as EEPROM and Flash memories). In either case, the increase in the number of bits per cell renders more critical the tolerance to disturbance, the retention of the information and the accuracy of the operations of reading and writing. In addition, the increment of the storage capacity demanded by the market tends to reduce the overall reliability. For these reasons it is envisaged that the use of error control codes will be fundamental above all for high capacity multilevel memories.

At the moment, commercially available memory devices with larger capacities contain some hundreds of millions of bits, and in the next few years it is forecast that memory devices with ever-increasing capacities will become available.

The increase in the number of cells tends to reduce the mean time to failure (MTTF) of the entire memory device. However, given the need to create increasingly reliable equipment or systems, the level of reliability required for the individual memory component becomes increasingly stringent. For this reason, dedicated design techniques are adopted allied to careful quality control on the production processes in order to prevent or reduce failures.

However, malfunctioning of the memory chip cannot be eliminated completely and can be reduced only at the expense of a reduction in performance or an increase in costs.

A very effective way to increase reliability is represented by the design of memories immune from error using error-control codes, that is, codes that are able to detect and correct errors in the data stored in memories.

In particular, codes with correction of single error, or detection of double error and correction of single error, are used in semiconductor memory devices of various types. In this connection, see, for example, K. Furutani, K. Arimoto, H. Miyamoto, T. Kobayashi, K.-I. Yasuda, and K. Mashiko, "*A Built-in Hamming Code ECC Circuit for DRAM's*", IEEE J. Solid-State Circuits, Vol. 24, No. 1, February 1989, pp. 50–56, and T. Tanzawa, T. Tanaka, K. Takeuchi, R. Shirota, S. Aritome, H. Watanabe, G. Hemink, K. Shimizu, S. Sato, Y. Takeuchi, K. Ohuchi, "*A Compact On-Chip ECC For Low-Cost Flash Memories*", IEEE J. Solid-State Circuits, Vol. 32, No. 5, May 1997, pp. 662–669.

The errors in the memories are normally classified as "soft" errors and "hard" errors. By "soft" error is meant a random, non-repetitive and non-permanent change in the state of a cell. "Soft" errors are caused by occasional electrical noise or are induced by radiation ($\alpha$ particles, cosmic rays, etc.), regard a very limited number of cells at a time, and may be recovered in the next writing cycle.

By "hard" error is instead meant a permanent physical failure associated to faults present in the device or created during its operation owing to incapacity of the materials to withstand the stresses applied. Generally "hard" errors are much rarer than "soft" errors.

Error-control codes enable drastic reduction in the effects of "soft" errors, which represent the more serious problem of the two, especially for multilevel memories. They can moreover prove useful also for the purpose of recovering some "hard" errors.

To protect the information to be stored in the memory it is necessary to add, to the bits that form each information word, a certain number of control bits, appropriately calculated. The operation that associates to each information word a precise value of the control bits is called encoding. The control bits calculated by the circuit that carries out encoding must be stored together with the information word.

Each word stored will be subsequently read together with the control bits that pertain to it. The decoding circuit is able to detect and correct a certain number of erroneous bits per word by appropriately comparing the value of the control bits with the value of the information bits.

The number of control bits that it is necessary to add to each information word is determined according to the length of the information word itself and the number of errors per word that it is desired to correct.

More in general, error-control encoding can be extended from the binary alphabet (containing only the two symbols "0" and "1") to a more extended alphabet containing q symbols. In this case, encoding consists in the addition of a certain number of symbols (no longer of bits) to each word to be stored, and the correction of the errors consists in the correction of the erroneous symbols.

This extension to the q-ary case is particularly suited to multilevel memories, in which each memory cell is able to store more than one bit (for example r bits). In this case, in fact, malfunctioning of one memory cell may degrade the value of all the bits stored in it. It is consequently more convenient to associate, to each block of r bits stored in a single cell, a q-ary symbol, i.e., one belonging to an alphabet constituted by $q=2^r$ different symbols. Each symbol is consequently stored in a different multilevel memory cell. In this way, each information word of k bits is viewed as a word formed by k/r q-ary symbols (equal to the number of memory cells that form each word), and the correction of a symbol is equivalent to the correction of all the r bits associated to it.

It is desirable that error-control methods integrated in a semiconductor memory satisfy three basic requisites:

the time required for the encoding operation and for the decoding operation (including error detection and correction) should affect the access time to the memory only to a minimum extent;

the additional area due to the encoding and decoding circuits and to the control cells should be minimized; and the technique used should at least guarantee the correction of any type of error on the individual cell, which, in the case of multilevel cells, may consist of the error on a number of bits.

For the encoding and decoding times not to degrade the access time, the typical approach is to use parallel encoding structures or matrix structures, which offer the highest computation speeds. For a more detailed treatment of the subject, see, for example, C. V. Srinivasan, "*Codes For Error Correction In High-Speed Memory Systems-Part I: Correction Of Cell Defects In Integrated Memories*", IEEE Trans. Comput., Vol. C-20, No. 8, August 1971, pp. 882–888.

As regards, instead, the second point, the area is minimized by choosing codes with characteristics suitable for the application and appropriately optimized.

The last point is finally guaranteed by the use of q-ary codes, which enable detection and correction of the errors on the memory cells, irrespective of the number of erroneous bits associated to each of them.

The multilevel memories designed to contain r bits per cell can, however, also operate by storing a smaller number of bits per cell. In this case, for writing and reading, it is possible to use a subset of the $2^r-1$ reference levels available. The extreme (and simplest) example of this operating condition is obtained when a multilevel memory is used as a normal two-level memory.

The choice of decreasing the number of levels reduces the storage capacity of the memory but increases its reliability. For example, in the case of nonvolatile memories, the reduction in the number of the levels enables guaranteeing the retention of the information for a longer time and in more unfavorable environmental conditions.

Normally, the choice of the operating modality is made in a permanent way by the manufacturer; in this case, the possibility referred to above may be interesting, for example, to obtain a memory with a smaller number of bits per cell as a subselection of one designed to contain a greater number of bits, in order to obtain an overall reduction in costs.

At present, however, to satisfy the growing demands of the market, memory devices are being designed in which also the end user can decide the operating modality on the basis of the type of use of the device, and there is consequently increasingly more felt the need to provide a multipurpose error-control method that is able, using the same circuits, to protect the data stored in cells that operate with a different number of levels.

This need is further strengthened by the fact that the memory devices of the coming generations, with large storage capacities, will be able to be configured sector by sector, and consequently will have internal sectors containing a different number of bits per cell (see, for example, U.S. Pat. No. 5,574,879).

Memory devices of this type will, for example, be able to be used in multimedia cards, enabling storage of the microcode for the microprocessor that manages the card in sectors with a low number of bits per cell, and storage of the user data in sectors with a high number of bits per cell.

BRIEF SUMMARY OF THE INVENTION

An embodiment of the present invention provides a method for constructing an error-control code for multilevel memory cells operating with a variable number of storage levels, and a multipurpose error-control method using said error-control code, which enable, employing the same circuits, protection of the data stored in cells that operate with a different number of levels.

BRIEF DESCRIPTION OF THE SEVERAL VIEWS OF THE DRAWING(S)

For a better understanding of the present invention, a preferred embodiment thereof is now described, purely by way of non-limiting example and with reference to the attached drawings, in which:

FIGS. 1, 2 and 3 show tables corresponding to a construction method according to the present invention;

FIGS. 4*a*, 4*b* and 5*a*, 5*b* show multiplier circuits used for the implementation of an error-control method according to the present invention;

DETAILED DESCRIPTION OF THE INVENTION

Figure 4B:
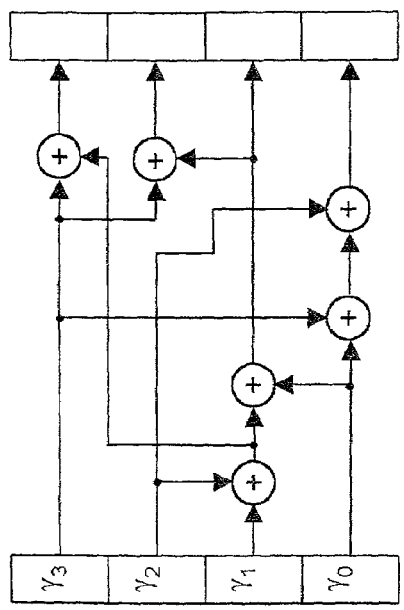

To facilitate understanding of the present invention, introduced hereinafter is some notation corresponding to a linear block encoding used by the present invention for detecting and correcting errors in multilevel memories. For a more detailed treatment of this subject, see, for example, W. W. Peterson, E. J. Weldon, *Error-Correcting Codes*, $2^{nd}$ ed., M.I.T. Press, Cambridge (Mass.), 1972, and R. E. Blahut, *Theory and Practice of Error Control Codes*, Addison-Wesley, Reading (Mass.), 1983.

In particular, we shall call q-ary symbols the elements of an alphabet containing q different symbols, we shall call information word the vector of k q-ary symbols to be written in the memory and we shall indicate said vector as follows:

$$i=(i_1, i_2, \ldots, i_k)$$

In linear block encoding, the information word is mapped biuniquely in a vector of n q-ary symbols (with n>k), which we shall call code word and indicate as follows:

$$\underline{c}=(c_1, c_2 \ldots , c_n)$$

The encoding operation can be described in algebraic form by introducing the matrix G, called generating matrix of the code (see, in this connection, W. W. Peterson, E. J. Weldon, *Error-Correcting Codes*, 2$^{nd}$ ed., M.I.T. Press, Cambridge (Mass.), 1983).

Each code word $\underline{c}$ can be generated simply by multiplying the information word by the generating matrix, as expressed in the following equation:

$$\underline{c}=\underline{i} \cdot G$$

where $\underline{i}$ and $\underline{c}$ are row vectors.

The matrix G is a rectangular matrix with k rows, n columns and rank k (for the application $\underline{i} \to \underline{c}$ to be injective)

For each linear code (n, k) there exists a matrix H, called control-of-parity matrix (see the aforementioned text *Error-Correcting Codes*), having n−k rows and n columns, such that:

$$G \cdot {}^t H = 0$$

where 0 indicates the matrix k×(n−k) with all zero elements, and $^t H$ indicates the transpose of the matrix H.

The n−k symbols, added during encoding, take the name of parity symbols or control symbols.

We shall call q-ary code (n, k) the set of the $q^k$ code words obtained by encoding all the possible information words, and we shall define capacity of correction of the q-ary code (n, k) the number t of errors (i.e., of erroneous q-ary symbols) per word that the code is able to correct.

The inequality below, known by the name of Hamming limit (see the aforementioned text *Error-Correcting Codes*), provides the minimum number of parity symbols required for a q-ary linear code (n, k) to have correction capacity t:

$$q^{n-k} \geq \sum_{i=0}^{t} \binom{n}{i}(q-1)^i \quad (1)$$

In the light of the notation introduced above, there follows the description of the procedure for constructing the generating matrix of a $b^s$-ary code (n, k), such that the same matrix may be utilized also for carrying out the operations of encoding and decoding for a b-ary code (n, k) having the same correction capacity as the starting code. In this way, a single encoding circuit and a single decoding circuit are obtained that can be used for both the codes.

In particular, with the sole purpose of facilitating the understanding of the problem of construction of the generating matrix, the application of the method according to the present invention will now be illustrated with a specific example, which in any case does not limit the applicability to the general case, and subsequently the feasibility of what has been illustrated in the specific example will be demonstrated in rigorous terms.

Consider, for example, the case of a 16-level memory that may be used also as a 4-level memory. The aim is to provide a error-correction circuit that is able to correct errors that involve groups of 4 bits associated to the same memory cell. At the same time, the circuit must be able to carry out the correction also in the 4-level modality, i.e., to correct errors that involve groups of 2 bits associated to the same memory cell.

Suppose that for the application to which the code is destined it is sufficient to correct only one error per word (t=1) and that each information word, in the 16-level operating modality, is formed by 16 hexadecimal symbols (k=16, $b^s$=16), whilst in the 4-level modality, it is formed by 16 quaternary symbols (k=16, b=4).

First of all, it is necessary to evaluate the number of parity symbols required in both of the operating modalities, resorting to the Hamming limit. In this case (k=16, t=1), thanks to relation (1) it is found that, both in base 16 (q=16) and in base 4 (q=4), 3 parity symbols are required (consequently, n=19). The generating matrix of the code in base 16 that can be used also as generating matrix of the code in base 4 can be obtained in the way described in what follows.

First, the generating matrix of the code in base 4 is constructed that satisfies the initial requisites for the values of n, k and t. In the example considered, a quaternary matrix that satisfies the requisites specified can be obtained by abbreviating the Hamming code (21, 18) in base 4 (for the definitions of Hamming code and of the abbreviation operation, see the aforementioned *Theory and Practice of Error Control Codes*). An example is provided by the following matrix:

$$G_1 = \begin{pmatrix} 1 & 0 & 0 & 0 & 0 & 0 & 0 & 0 & 0 & 0 & 0 & 0 & 0 & 0 & 0 & 0 & 1 & 1 \\ 0 & 1 & 0 & 0 & 0 & 0 & 0 & 0 & 0 & 0 & 0 & 0 & 0 & 0 & 0 & 0 & 1 & 2 \\ 0 & 0 & 1 & 0 & 0 & 0 & 0 & 0 & 0 & 0 & 0 & 0 & 0 & 0 & 0 & 0 & 1 & 3 \\ 0 & 0 & 0 & 1 & 0 & 0 & 0 & 0 & 0 & 0 & 0 & 0 & 0 & 0 & 0 & 1 & 0 & 1 \\ 0 & 0 & 0 & 0 & 1 & 0 & 0 & 0 & 0 & 0 & 0 & 0 & 0 & 0 & 0 & 1 & 0 & 2 \\ 0 & 0 & 0 & 0 & 0 & 1 & 0 & 0 & 0 & 0 & 0 & 0 & 0 & 0 & 0 & 1 & 0 & 3 \\ 0 & 0 & 0 & 0 & 0 & 0 & 1 & 0 & 0 & 0 & 0 & 0 & 0 & 0 & 0 & 1 & 1 & 0 \\ 0 & 0 & 0 & 0 & 0 & 0 & 0 & 1 & 0 & 0 & 0 & 0 & 0 & 0 & 0 & 1 & 1 & 1 \\ 0 & 0 & 0 & 0 & 0 & 0 & 0 & 0 & 1 & 0 & 0 & 0 & 0 & 0 & 0 & 1 & 1 & 2 \\ 0 & 0 & 0 & 0 & 0 & 0 & 0 & 0 & 0 & 1 & 0 & 0 & 0 & 0 & 0 & 1 & 1 & 3 \\ 0 & 0 & 0 & 0 & 0 & 0 & 0 & 0 & 0 & 0 & 1 & 0 & 0 & 0 & 0 & 1 & 2 & 0 \\ 0 & 0 & 0 & 0 & 0 & 0 & 0 & 0 & 0 & 0 & 0 & 1 & 0 & 0 & 0 & 1 & 2 & 1 \\ 0 & 0 & 0 & 0 & 0 & 0 & 0 & 0 & 0 & 0 & 0 & 0 & 1 & 0 & 0 & 1 & 2 & 2 \\ 0 & 0 & 0 & 0 & 0 & 0 & 0 & 0 & 0 & 0 & 0 & 0 & 0 & 1 & 0 & 1 & 2 & 3 \\ 0 & 0 & 0 & 0 & 0 & 0 & 0 & 0 & 0 & 0 & 0 & 0 & 0 & 0 & 1 & 0 & 1 & 3 & 0 \\ 0 & 0 & 0 & 0 & 0 & 0 & 0 & 0 & 0 & 0 & 0 & 0 & 0 & 0 & 0 & 1 & 1 & 3 & 1 \end{pmatrix}$$

Now we seek to convert the quaternary matrix $G_1$ into a hexadecimal matrix, which will generate a code in base 16 with the same correction capacity as the initial quaternary code (referred, however, to hexadecimal symbols).

The aim is to find the right biunique correspondence between the quaternary elements {0, 1, 2, 3} and four of the hexadecimal elements {0, 1, 2, 3, 4, 5, 6, 7, 8, 9, A, B, C, D, E, F}. The four hexadecimal elements corresponding to the quaternary elements {0, 1, 2, 3} are referred to as elements isomorphic to the quaternary elements {0, 1, 2, 3}.

The correspondence must be such as to provide a matrix which, when used in 4-level modality, will generate code words that contain only the four hexadecimal symbols chosen.

There follows a description of how to obtain the correspondences that satisfy this condition for the general case.

In the specific case taken as example, there exist two biunique correspondences that enable a correct conversion of the generating matrix $G_1$:

$$\begin{array}{cc} 0 \leftrightarrow 0 & 0 \leftrightarrow 0 \\ 1 \leftrightarrow 1 & 1 \leftrightarrow 1 \\ 2 \leftrightarrow 6 & 2 \leftrightarrow B \\ 3 \leftrightarrow 7 & 3 \leftrightarrow A \end{array}$$

In other words, according to the first correspondence, the hexadecimal elements that are isomorphic to the quaternary elements {0, 1, 2, 3} are respectively {0, 1, 6, 7}, whilst, according to the second correspondence, the hexadecimal elements that are isomorphic to the quaternary elements {0, 1, 2, 3} are respectively {0, 1, B, A}.

Using the first correspondence, as generating matrix we obtain:

$$G_2 = \begin{pmatrix} 1 & 0 & 0 & 0 & 0 & 0 & 0 & 0 & 0 & 0 & 0 & 0 & 0 & 0 & 0 & 0 & 1 & 1 \\ 0 & 1 & 0 & 0 & 0 & 0 & 0 & 0 & 0 & 0 & 0 & 0 & 0 & 0 & 0 & 0 & 1 & 6 \\ 0 & 0 & 1 & 0 & 0 & 0 & 0 & 0 & 0 & 0 & 0 & 0 & 0 & 0 & 0 & 0 & 1 & 7 \\ 0 & 0 & 0 & 1 & 0 & 0 & 0 & 0 & 0 & 0 & 0 & 0 & 0 & 0 & 0 & 1 & 0 & 1 \\ 0 & 0 & 0 & 0 & 1 & 0 & 0 & 0 & 0 & 0 & 0 & 0 & 0 & 0 & 0 & 1 & 0 & 6 \\ 0 & 0 & 0 & 0 & 0 & 1 & 0 & 0 & 0 & 0 & 0 & 0 & 0 & 0 & 0 & 1 & 0 & 7 \\ 0 & 0 & 0 & 0 & 0 & 0 & 1 & 0 & 0 & 0 & 0 & 0 & 0 & 0 & 0 & 1 & 1 & 0 \\ 0 & 0 & 0 & 0 & 0 & 0 & 0 & 1 & 0 & 0 & 0 & 0 & 0 & 0 & 0 & 1 & 1 & 1 \\ 0 & 0 & 0 & 0 & 0 & 0 & 0 & 0 & 1 & 0 & 0 & 0 & 0 & 0 & 0 & 1 & 1 & 6 \\ 0 & 0 & 0 & 0 & 0 & 0 & 0 & 0 & 0 & 1 & 0 & 0 & 0 & 0 & 0 & 1 & 1 & 7 \\ 0 & 0 & 0 & 0 & 0 & 0 & 0 & 0 & 0 & 0 & 1 & 0 & 0 & 0 & 0 & 1 & 6 & 0 \\ 0 & 0 & 0 & 0 & 0 & 0 & 0 & 0 & 0 & 0 & 0 & 1 & 0 & 0 & 0 & 1 & 6 & 1 \\ 0 & 0 & 0 & 0 & 0 & 0 & 0 & 0 & 0 & 0 & 0 & 0 & 1 & 0 & 0 & 1 & 6 & 6 \\ 0 & 0 & 0 & 0 & 0 & 0 & 0 & 0 & 0 & 0 & 0 & 0 & 0 & 1 & 0 & 0 & 1 & 6 & 7 \\ 0 & 0 & 0 & 0 & 0 & 0 & 0 & 0 & 0 & 0 & 0 & 0 & 0 & 0 & 1 & 0 & 1 & 7 & 0 \\ 0 & 0 & 0 & 0 & 0 & 0 & 0 & 0 & 0 & 0 & 0 & 0 & 0 & 0 & 0 & 1 & 1 & 7 & 1 \end{pmatrix}$$

Since the digital circuits that carry out encoding and decoding operate in binary logic, it is necessary to describe the operations that regard the matrix $G_2$ in terms of binary operations. In addition, the hexadecimal elements must be treated exploiting their binary notation.

The matrix $G_2$ thus obtained is able to operate in 4-level and 16-level modality in 4-level modality the quaternary symbols (i.e., the pairs of bits) are mapped in hexadecimal symbols (i.e., in groups of 4 bits) following the same biunique correspondence for obtaining the matrix. In this case:

00 (=0) $\leftrightarrows$ 0000 (=0)

01 (=1) $\leftrightarrows$ 0001 (=1)

10 (=2) $\leftrightarrows$ 0010 (=6)

11 (=3) $\leftrightarrows$ 0111 (=7)

The encoding and decoding circuits always require the same number of input bits and always furnish the same number of output bits, irrespective of whether the operating modality is a 16-level one or a 4-level one. In the case of 4-level operation of the memory, it is the task of particular circuits that precede the encoder and that follow the decoder to map each quaternary symbol (formed by 2 bits) in the corresponding hexadecimal symbol (formed by 4 bits). In particular, the network that precedes the encoder converts groups of 2 bits into groups of 4 bits according to the correspondence referred to above, whilst the network that follows the decoder carries out the conversion of groups of 4 bits into groups of 2 bits, again according to the same correspondence. A more detailed explanation of this aspect of the invention will be given in what follows with reference to FIGS. 7 and 8.

The aim is now to illustrate in rigorous terms the feasibility of what has just been set forth as regards the aforementioned specific example.

In particular, the demonstration that follows will take into consideration the binary base; i.e., it will be explained how to obtain a biunique relation that enables conversion of b-ary elements into $b^s$-ary elements, with b=2.

What has been said regarding the case b=2, however, is applicable as such to the conversion of b-ary elements into $b^s$-ary elements for any value of b.

To carry out this rigorous illustration it is indispensable to recall some notions of algebra of finite fields.

We shall indicate by $GF(q^s)$ the Galois field (i.e., the finite-element field) containing $q^s$ elements (for a detailed treatment of the subject see the aforementioned *Theory and Practice of Error Control Codes*).

Since $GF(q^s)$ is a finite field, multiplying one of its elements β by itself a certain number of times we obtain again β. We define as order of β the minimum integer for which $β^1=β$ (for a detailed treatment of the subject see the aforementioned *Error-Correcting Codes*).

Given two fields $GF(q^s)$ and $GF(q^r)$, it can be shown that $GF(q^r)$ is a subfield of $GF(q^s)$ if and only if s is divisible by r. In this case, $GF(q^s)$ is called the extended field of $GF(q^r)$.

It can be shown that a q-ary linear block code (n, k) is a vector subspace of dimension k of the n-dimensional vector space constructed on GF(q).

Within each field $GF(q^s)$ there exist q elements that constitute the subfield GF(q) with the same operations defined in $GF(q^s)$. The elements of GF(q) are the only elements that in $GF(q^s)$ have the order q.

In each Galois field $GF(q^s)$ there exists a particular element α, called primitive element, having order $q^s$. Multiplying α by itself, all the other elements of the field are obtained except for the zero. Consequently, expressing the elements of $GF(q^s)$ as powers of α, it is possible to recognize the elements of the subfield GF(q), since these are the elements 0, 1 and the other elements of $GF(q^s)$ having an order equal to the elements of GF(q), i.e., the terms with exponent equal to $(q^s-1)/(q-1)$, $2(q^s-1)(q-1)$, ..., $(q-2)(q^s-1)/(q-1)$.

Both to highlight a biunique correspondence between the elements of a field $GF(q^s)$ with those of the subfield GF(q) and to obtain a description in binary form of the operations to be carried out during encoding and decoding, it is useful to resort to the polynomial description of the Galois fields.

A polynomial p(x) of degree r on GF(q) is a polynomial in the unknown quantity x the coefficients of which and the known term of which are elements of GF(q).

The operations between two polynomials on GF(q) coincide with the usual operations between polynomials, with the exception that the sums and the products between the coefficients are made in GF(q).

Each extended field $GF(q^s)$ can be generated starting from the subfield GF(q), resorting to the polynomial representation. There exists in fact at least one polynomial of degree s on GF(q), thanks to which it is possible to construct the field $GF(q^s)$. This polynomial is a primitive polynomial of GF(q) (for a detailed treatment of the subject, see the aforementioned *Theory and Practice of Error Control Codes*).

Thanks to the primitive polynomial, each element of $GF(q^s)$ can be represented in q-ary form by means of a polynomial on GF(q) of degree (s−1), and the operations in the extended field $GF(q^s)$ can be obtained by the operations of addition and multiplication between polynomials on GF(q).

To convert a matrix on $GF(q^s)$ into a matrix on GF(q) it is sufficient to have available a representation of $GF(q^s)$ on GF(q) and a representation of $GF(q^s)$ on GF(2). Setting $q=2^r$, the first representation can be obtained by means of a primitive polynomial of degree s on GF(q), whilst the second can be obtained by means of a primitive polynomial of degree sr on GF(2).

In the specific example described previously, the following were used: the representation of the field GF(16) on GF(4) obtained with the quaternary polynomial $p_1(x)=x^2+x+2$, the representation of the field GF(16) on GF(2) obtained with the binary polynomial $p_2(x)=x^4+x+1$, both shown in the table of FIG. 1, and the representation of the field GF(4) on GF(2) obtained with the binary polynomial $p_3(x)=x^2+x+1$, appearing in Table II of FIG. 2.

In particular, in Table I, the hexadecimal notation associated to the corresponding binary polynomial notation is none other than the representation in hexadecimal base of the coefficients of the unknown terms of the respective binary polynomial. In other words, for each of the binary polynomials, a binary word is formed with the coefficients of the various terms of the binary polynomial, and this binary word is converted into the hexadecimal base, thus obtaining the corresponding hexadecimal notation.

Likewise, in Table II the quaternary notation associated to the corresponding binary polynomial notation is none other than the representation in quaternary base of the coefficients of the unknown terms of the respective binary polynomial.

From an examination of Table I, it is possible to recognize the elements of GF(16) that are elements of GF(4). In exponential notation these correspond to the elements 0, 1, $\alpha^5$ and $\alpha^{10}$, whilst in hexadecimal notation (obtained from the binary polynomial notation by converting into hexadecimal base the coefficients of the polynomials associated to each polynomial) these are the elements 0, 1, 6 and 7.

In particular, it may be noted how, apart from 0 and 1, the association of which is evident and immediate, both $\alpha^5$ and $\alpha^{10}$ have multiplicity four, and hence the binary polynomial representations of GF(16) on GF(2) and of GF(4) on GF(2) are not alone sufficient for establishing whether the exact correspondence is 2→6 and 3→7 or 2→7 and 3→6. However, through the polynomial representation of GF(16) on GF(4), the correct association is automatic, as shown in Table I.

It can be shown that, once n, k and t are fixed, if the Hamming limit defined by the relation (1) is satisfied for $q=p^r$, then the same limit is satisfied also for $q=p^{rs}$ (with p prime, and r and s positive integers).

Consequently, it is always possible to convert the generating matrix of a linear block code (n, k) on GF(p) into the generating matrix of a linear block code (n, k) on any extended field $GF(p^{rs})$.

The extension can be made by mapping each element of $GF(p^r)$, which appears in the starting matrix, in the corresponding element of the extended field. The correspondence between the elements of the two fields is expressed in the representation of $GF(p^{rs})$ on $GF(p^r)$, alongside which is to be set a representation of $GF(p^{rs})$ on $GF(p^r)$, which enables the performance in p-ary logic of the operations of encoding and decoding.

In particular, for each linear block code on $GF(2^{rs})$ the operations of encoding and decoding can be done in binary logic, resorting to the binary polynomial representation of the elements of the field.

The generating matrix obtained generates a code (n, k) on $GF(p^{rs})$ that is isomorphic to a code (n, k) on $GF(p^r)$ having at least the same correction capacity as the code on the extended field. It is thus possible to exploit the same encoding and decoding circuits for words with the same number of symbols on $GF(p^r)$ or on $GF(p^{rs})$.

To make the encoding and decoding circuits in binary logic it is necessary to have a description of the operations of $GF(p^{rs})$ in terms of operations between bits. Resorting to the representation in binary-polynomial form, in each Galois field with a number of elements equal to a power of 2 it is possible to carry out all the operations of addition and multiplication between the elements of the field by means of the operations of addition and multiplication in GF(2). Such operations coincide, respectively, with the logic operations of exor (exclusive or) and of and.

Each operation of addition between two elements of $GF(2^m)$ can be consequently performed simply by making in GF(2) the m+1 additions between the coefficients of the terms of equal degree of the two polynomials.

The multiplication of an unknown element w(x) of $GF(2^m)$ for a given element e(x) of the same field can be done in binary form resorting to the polynomial representation in the following way:

$$y(x)=R_{p(x)}\{w(x)e(x)\}=y_{m-1}x^{m-1}+y_{m-2}x^{m-2}+\ldots+y_0$$

where the coefficients $y_i$ are binary coefficients, p(x) is the primitive binary polynomial with which $GF(2^m)$ is constructed, and $R_{p(x)}\{g(x)\}$ indicates the remainder of the division of the polynomial g(x) by the polynomial p(x).

At this point, it may be noted that the circuit implementation of the blocks which carry out the multiplications for the elements of the generating matrix other than 0 and 1 changes as the primitive binary polynomial used for representing the extended field varies. For instance, returning to the example examined previously, the binary-polynomial representation of the field GF(16) obtained by means of the polynomial $p_4(x)=x^4+x^3+1$, appearing in Table III of FIG. 3, requires a different number of logic gates both for carrying out the multiplication by $\alpha^5$, and for carrying out the multiplication by $\alpha^{10}$.

In fact, to carry out the multiplication of an unknown element γ by $\alpha^5$, in the case in which the polynomial representation appearing in Table I is chosen, we proceed as follows:

$$\gamma=\gamma_3 x^3+\gamma_2 x^2+\gamma_1 x+\gamma_0 \gamma \cdot \alpha^5 = R_{p_2}(x)\{\gamma_3 x^5+(\gamma_3+\gamma_2)x^4+(\gamma_2+\gamma_1)x^3+(\gamma_1+\gamma_0)x^2+\gamma_0 x\}$$

where $R_{p_2}(x)\{g(x)\}$ indicates the remainder of the division of the polynomial g(x) by the polynomial $p_2(x)$. Hence we obtain:

$$\gamma \cdot \alpha^5 = (\gamma_2+\gamma_1)x^3+(\gamma_3+\gamma_1+\gamma_0)x^2+(\gamma_2+\gamma_0)x+(\gamma_3+\gamma_2)$$

The operations of addition between the coefficients $\gamma_i$ are binary additions and consequently can be performed with logic gates of the exor type.

Likewise, for the multiplication by $\alpha^{10}$ we have:

$$\gamma \cdot \alpha^{10} = (\gamma_3+\gamma_2+\gamma_1)x^3+(\gamma_3+\gamma_2+\gamma_1+\gamma_0)x^2+(\gamma_2+\gamma_1+\gamma_0)x+(\gamma_3+\gamma_2+\gamma_0)$$

Figure 4A:
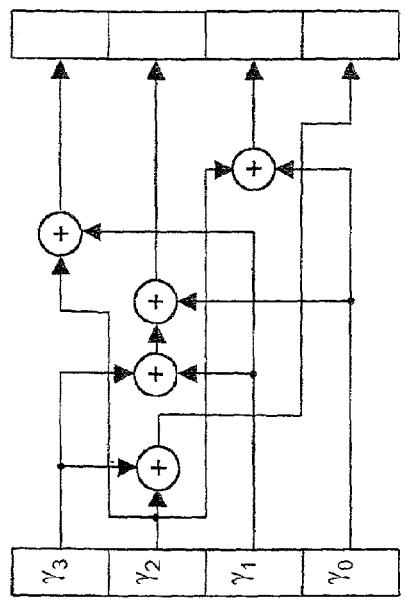

Consequently, the multiplications by $\alpha^5$ and $\alpha^{10}$ in GF(16) can be performed with the circuits illustrated, respectively, in FIGS. 4a and 4b.

Exploiting, instead, the representation of Table III, the multiplication of y by $\alpha^5$ is described by the following polynomial:

$$\gamma \cdot \alpha^5 = (\gamma_3+\gamma_1+\gamma_0)x^3+(\gamma_3+\gamma_2+\gamma_1)x^2+(\gamma_3+\gamma_2+\gamma_1)x+\gamma_0)x+(\gamma_2+\gamma_1+\gamma_0)$$

and the multiplication of $\gamma$ by $\alpha^{10}$ is described by $$\gamma \cdot \alpha^{10} = (\gamma_1+\gamma_0)x^3+(\gamma_3+\gamma_1)x^2+(\gamma_3+\gamma_2+\gamma_0)x+(\gamma_2+\gamma_1)$$

Figure 5B:
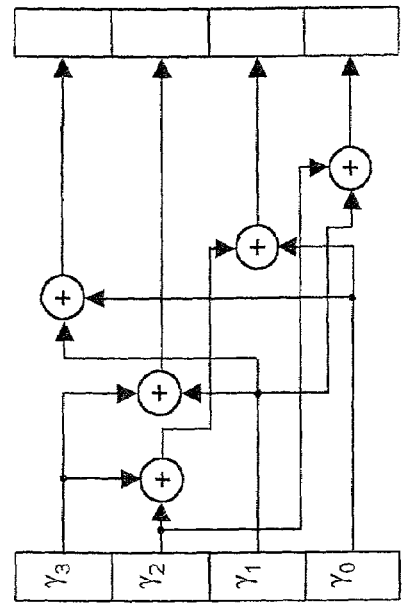
Figure 5A:
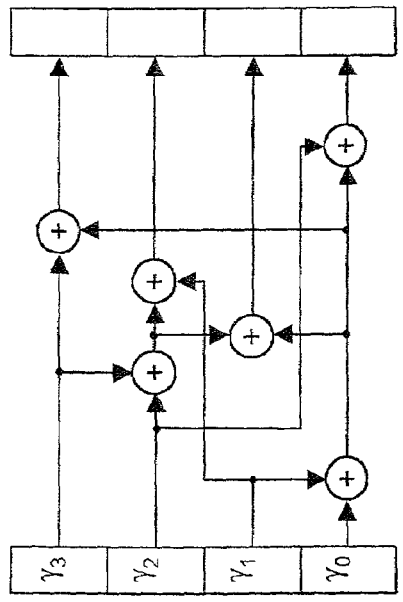

The corresponding multiplication circuits are illustrated, respectively, in FIGS. 5a and 5b.

Note that it is not always necessary to use an exor for each "+" sign between the coefficients in the equation that provides the product. In fact the additions, even if they are in different positions, can involve the same coefficients, and it is consequently possible to reduce the number of logic gates.

From a comparison of FIGS. 4a, 4b and 5a, 5b, it appears evident that, as far as the multiplication by the element $\alpha^5$ is concerned, the first representation requires a smaller number of exor gates (five as against six).

To obtain an error-control code on $GF(q^s)$ with given specifications in terms of k and t that can be used also on GF(q), it is first necessary to calculate the generating matrix (or the parity-control matrix) of a code on GF(q). To obtain the matrix, we can resort to a known family of codes, such as the Hamming codes and the BCH codes (for a detailed treatment of the subject, see, for example, S. Benedetto, E. Biglieri, V. Castellani, *Digital Transmission Theory*, Prentice Hall, Englewood Cliffs (N.J.), 1987).

Next, the matrix obtained is abbreviated to the desired value of k. For the abbreviation of the matrix, it is necessary to take into consideration the possible representations of $GF(q^s)$ on GF(2) and evaluate which of these enables the circuit blocks that occupy the smallest area to be implemented. Once the representation has been chosen, it is possible to proceed to the abbreviation of the code by eliminating the columns of the parity-control matrix which contain the greatest number of symbols of $GF(q^s)$ for which the multiplication is more costly in terms of area occupied.

Returning to the example considered previously, the generating matrix $G_1$ was obtained by abbreviating the generating matrix of the Hamming code (21, 18) on GF(4). To minimize the number of logic gates that form the encoding circuit, the abbreviation must proceed with the intent of minimizing the number of symbols 2 and 3 (i.e., $\alpha^5$ and $\alpha^{10}$). After the binary polynomial for the binary representation of GF(16) has been chosen, it is possible to determine which symbol between $\alpha^5$ and $\alpha^{10}$ requires the lower number of logic gates. This symbol is to be preferred during abbreviation.

In the example considered, by choosing as primitive polynomial for the construction of GF(16) the polynomial $p_2(x)$, the terms in $\alpha^5$ that require 5 exor gates as against the 6 exor gates required by the multiplication by $\alpha^{10}$ are to be preferred. The most convenient generating matrix in terms of saving on area is found to be the matrix $G_2$ written above. Instead, exploiting the representation of GF(16) obtained by means of the polynomial $p_3(x)$, it is more advantageous to use the matrix $G_3$ indicated below, since in this case the multiplication by $\alpha^{10}$=A requires five exor gates as against the six exor gates of $\alpha^5$=B.

$$G_3 = \begin{pmatrix} 1 & 0 & 0 & 0 & 0 & 0 & 0 & 0 & 0 & 0 & 0 & 0 & 0 & 0 & 0 & 0 & 1 & 1 \\ 0 & 1 & 0 & 0 & 0 & 0 & 0 & 0 & 0 & 0 & 0 & 0 & 0 & 0 & 0 & 0 & 1 & B \\ 0 & 0 & 1 & 0 & 0 & 0 & 0 & 0 & 0 & 0 & 0 & 0 & 0 & 0 & 0 & 0 & 1 & A \\ 0 & 0 & 0 & 1 & 0 & 0 & 0 & 0 & 0 & 0 & 0 & 0 & 0 & 0 & 0 & 1 & 0 & 1 \\ 0 & 0 & 0 & 0 & 1 & 0 & 0 & 0 & 0 & 0 & 0 & 0 & 0 & 0 & 0 & 1 & 0 & B \\ 0 & 0 & 0 & 0 & 0 & 1 & 0 & 0 & 0 & 0 & 0 & 0 & 0 & 0 & 0 & 1 & 0 & A \\ 0 & 0 & 0 & 0 & 0 & 0 & 1 & 0 & 0 & 0 & 0 & 0 & 0 & 0 & 0 & 1 & 1 & 0 \\ 0 & 0 & 0 & 0 & 0 & 0 & 0 & 1 & 0 & 0 & 0 & 0 & 0 & 0 & 0 & 1 & 1 & 1 \\ 0 & 0 & 0 & 0 & 0 & 0 & 0 & 0 & 1 & 0 & 0 & 0 & 0 & 0 & 0 & 1 & 1 & B \\ 0 & 0 & 0 & 0 & 0 & 0 & 0 & 0 & 0 & 1 & 0 & 0 & 0 & 0 & 0 & 1 & 1 & A \\ 0 & 0 & 0 & 0 & 0 & 0 & 0 & 0 & 0 & 0 & 1 & 0 & 0 & 0 & 0 & 1 & B & 0 \\ 0 & 0 & 0 & 0 & 0 & 0 & 0 & 0 & 0 & 0 & 0 & 1 & 0 & 0 & 0 & 1 & B & 1 \\ 0 & 0 & 0 & 0 & 0 & 0 & 0 & 0 & 0 & 0 & 0 & 0 & 1 & 0 & 0 & 1 & A & 0 \\ 0 & 0 & 0 & 0 & 0 & 0 & 0 & 0 & 0 & 0 & 0 & 0 & 0 & 1 & 0 & 0 & 1 & A & 1 \\ 0 & 0 & 0 & 0 & 0 & 0 & 0 & 0 & 0 & 0 & 0 & 0 & 0 & 0 & 1 & 0 & 1 & A & B \\ 0 & 0 & 0 & 0 & 0 & 0 & 0 & 0 & 0 & 0 & 0 & 0 & 0 & 0 & 0 & 1 & 1 & A & A \end{pmatrix}$$

Figure 6:
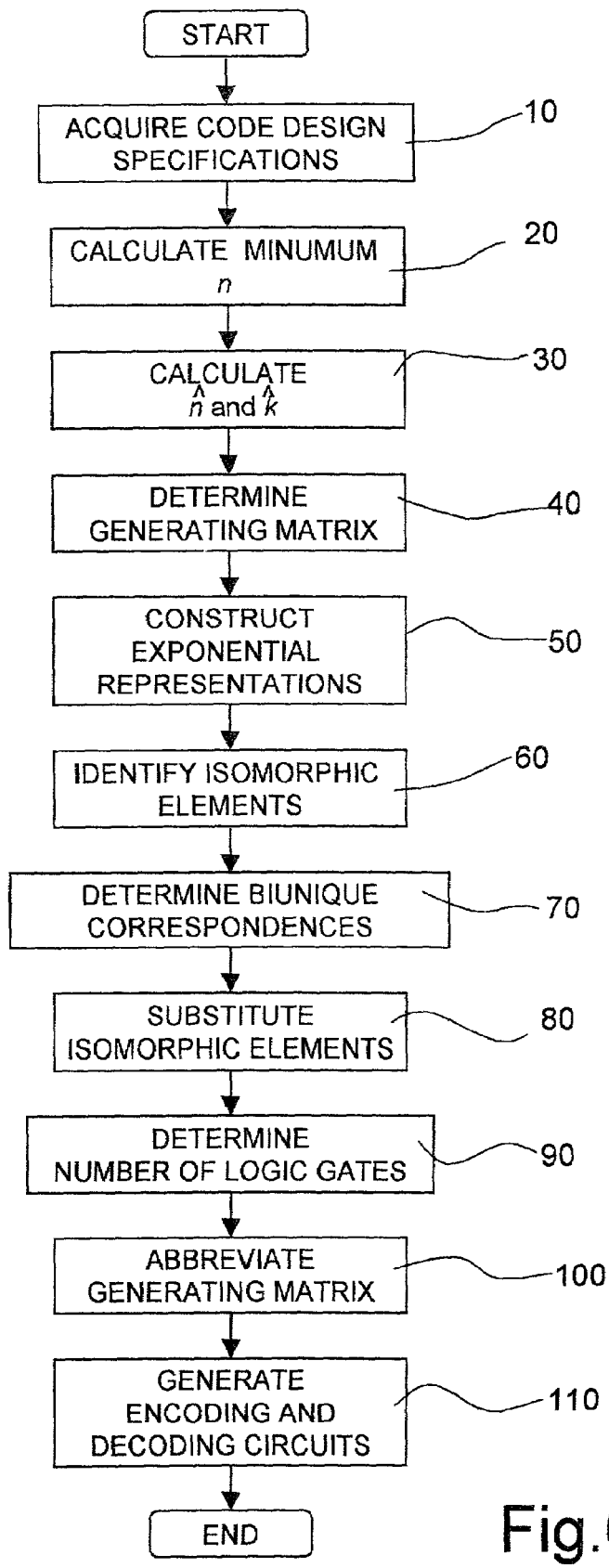
FIG. 6 shows a flowchart of the operations corresponding to the construction of an error-control method according to the present invention.

In general, then, given the values of k and t, the procedure to follow for constructing an error-control code that is able to operate on memory cells operating with a number of levels that can assume all the values of the set $\{b^{a_1}, b^{a_1 a_2}, \ldots, b^{a_1 a_2 a_h}\}$, with b, $a_1, \ldots, a_h$ positive integers, is the following (see also the flowchart illustrated in FIG. 6):

1. Once k, t, $b^{a_1}, b^{a_1 a_2}, \ldots, b^{a_1 a_2 \cdots a_h}$, which represent the design specifications of the error-control code that it is desired to obtain, have been acquired (block 10), calculate the minimum value of n such that the Hamming limit defined by the relation (1) given above is satisfied (block 20).

2. Given n and k, calculate the maximum values of n and k, denoted hereinafter respectively by n̂ and k̂, which satisfy the Hamming limit for $q=b^{a_1}$, t and (n̂−k̂)=(n−k) (block 30).

In other words, since the value of n calculated in the preceding point using relation (1) represents the number of symbols of a code word of an abbreviated q-ary linear code, and since, consequently, the n−k parity symbols of said abbreviated linear code represent the minimum number of control symbols required for the code to have the correction capacity t, in point 2 relation (1) is again used to calculate, given the values of n and k of the abbreviated q-ary linear code, the values n̂ and k̂ of the corresponding non-abbreviated q-ary linear code.

3. Determine the generating matrix of the abbreviated code (n̂, k̂) on $GF(b^{a_1})$ with t given (block 40).

4. Construct the exponential representations of the fields $GF(b^{a_1})$, $GF(b^{a_1 a_2})$, $\ldots$, $GF(b^{a_1 a_2 \cdots a_h})$ (block 50).

5. On the basis of the exponential representations referred to in the previous point, identify the elements of the field $GF(b^{a_1 a_2 \cdots a_h})$ that also form part of the fields $GF(b^{a_1})$, $GF(b^{a_1 a_2})$, $\ldots$, $GF(b^{a_1 a_2 \cdots a_{h-1}})$ (block 60).

In particular, the elements of $GF(b^{a_1 a_2 a_h})$ that also form part of $GF(b^{a_1})$, $GF(b^{a_1 a_2})$, $\ldots$, $GF(b^{a_1 a_2 \cdots a_{h-1}})$ are the ones that have a multiplicity of, respectively, $b^{a_1}$, $b^{a_1 a_2}$, $\ldots$, $b^{a_1 a_2 \cdots a_{h-1}}$. In the specific example considered previously, the elements of GF(16) that form part of GF(4) are the symbols 0, 1, $\alpha^5$ and $\alpha^{10}$, in that they are the only ones that have a multiplicity equal to four, i.e., they are the only ones that, multiplied four times by themselves, yield a result that is always the same.

In addition, it is emphasized that in the literature the definition of multiplicity is not unique. In particular, in some texts it is defined, as in this treatment, as the number of times that an element of the finite-element field must be multiplied by itself to obtain the element itself once again, whilst in other texts the multiplicity is a linear function of said number. Consequently, the identification of the elements of $GF(b^{a_1 a_2 \cdots a_h})$ that also form part of $GF(b^{a_1})$, $F(b^{a_1 a_2})$, ..., $GF(b^{a_1 a_2 \cdots a_{h-1}})$ can also be made using a definition of multiplicity different from the one used in this treatment, without thereby modifying, in any way, what has been described.

6. Next, establish the biunique correspondences between the elements of the field $GF(b^{a_1 a_2 \cdots a_h})$ and the elements of the fields $GF(b^{a_1})$, $GF(b^{a_1 a_2})$, ..., $GF(b^{a_1 a_2 \cdots a_{h-1}})$ isomorphic to them, identified in the previous point (block 70), and then substitute each of the elements of the generating matrix on $GF(b^{a_1})$ referred to in point 3 with the corresponding isomorphic element belonging to $GF(b^{a_1 a_2 \cdots a_h})$, thus obtaining a multipurpose generating matrix which, together with the biunique correspondences between the elements of the fields $GF(b^{a_1})$, $GF(b^{a_1 a_2})$, ..., $GF(b^{a_1 a_2 \cdots a_{h-1}})$ referred to above, and the elements of the field $GF(b^{a_1 a_2 a_h})$ that are isomorphic to them, defines the desired multipurpose error-control code (block 80).

In particular, to establish the biunique correspondences between the elements of the fields $GF(b^{a_1})$, $GF(b^{a_1 a_2})$, ..., $GF(b^{a_1 a_2 \cdots a_{h-1}})$ and the elements of the field $GF(b^{a_1 a_2 \cdots a_h})$ isomorphic to them, first construct the binary polynomial representations of all the fields $GF(b^{a_1})$, $GF(b^{a_1 a_2})$, ..., $GF(b^{a_1 a_2 \cdots a_h})$ by means of respective primitive polynomials respectively of degree $a_1$, $a_1$, $a_1 a_2$, ..., $a_1 a_2 \ldots a_h$ on $GF(2)$, through which to each element of $GF(b^{a_1})$, $GF(b^{a_1 a_2})$, ..., $GF(b^{a_1 a_2 \cdots a_h})$ there is associated a corresponding binary polynomial of lower degree than the respective base, i.e., to each element of $GF(b^{a_1})$ there is associated a corresponding binary polynomial of a degree lower than $a_1$, to each element of $GF(b^{a_1 a_2})$ there is associated a corresponding binary polynomial of degree lower than $a_1 a_2$, and so forth up to $GF(b^{a_1 a_2 \cdots a_h})$, to each element of which there is associated a corresponding binary polynomial of degree lower than $a_1 a_2 \ldots a_h$.

The biunique correspondences between the elements of the field $GF(b^{a_1 a_2 \cdots a_h})$ and the elements of the fields $GF(b^{a_1})$, $GF(b^{a_1 a_2})$, ..., $GF(b^{a_1 a_2 \cdots a_{h-1}})$ that are isomorphic to them are consequently established using these binary polynomial representations, in the way described in what follows.

For each element of $GF(b^{a_1 a_2 \cdots a_h})$ isomorphic to an element of $GF(b^{a_1})$, a first binary word is formed with the coefficients of the unknown terms of the binary polynomial associated to the element of $GF(b^{a_1 a_2 \cdots a_h})$ and this binary word is converted into the base $b^{a_1 a_2 \cdots a_h}$ to obtain a first symbol; next, a second binary word is formed with the coefficients of the unknown terms of the binary polynomial associated to the element of $GF(b^{a_1})$, and this binary word is converted into a figure in the base $b^{a_1}$, so obtaining a second symbol; the two symbols thus obtained define the biunique correspondence sought between the element of $GF(b^{a_1 a_2 \cdots a_h})$ and the element of $GF(b^{a_1})$ isomorphic to it.

Repeating what has been described above for all the elements of $GF(b^{a_1 a_2 \cdots a_h})$ isomorphic to the elements of $GF(b^{a_1})$ for all the elements of $GF(b^{a_1 a_2 \cdots a_h})$ isomorphic to the elements of $GF(b^{a_1 a_2})$, and so forth up to all the elements of $GF(b^{a_1 a_2 \cdots a_h})$ isomorphic to the elements of $GF(b^{a_1 a_2 \cdots a_{h-1}})$ the biunique correspondences sought between the elements of the field $GF(b^{a_1 a_2 \cdots a_h})$ and the elements of the fields $GF(b^{a_1})$, $GF(b^{a_1 a_2})$, ..., $GF(b^{a_1 a_2 \cdots a_{h-1}})$ that are isomorphic to them are obtained.

In the specific example considered previously (see Table I), the symbol corresponding to each of the four elements 0, 1, $\alpha^5$ and $\alpha^{10}$ is none other than the representation in hexadecimal base of the binary word formed by the coefficients of the unknown terms of the binary polynomial associated to said element.

In the case where there are a number of elements of the subfield that have the same multiplicity, the association between these elements and the isomorphic ones of the corresponding subfield can be made by resorting to the polynomial representation of the field $GF(b^{a_1 a_2 \cdots a_h})$ obtained with polynomials constructed on the subfield.

For example, if a number of elements of the subfield $GF(b^{a_1 a_2 \cdots a_i})$, with $i \leq h$, have the same multiplicity, then the association between these elements of $GF(b^{a_1 a_2 \cdots a_i})$ and the elements of $GF(b^{a_1 \cdots a_2 a_h})$ isomorphic to them can be made by constructing the polynomial representation of $GF(b^{a_1 a_2 \cdots a_h})$ on $GF(b^{a_1 a_2 \cdots a_i})$; i.e., it can be obtained by means of a primitive polynomial of degree $a_i + 1 \ldots a_h$ on $GF(b^{a_1 a_2 \cdots a_i})$. This polynomial representation automatically yields the association sought.

In the specific example considered previously in this treatment (see once again Table I), there are two elements of $GF(4)$ that have a multiplicity of four: these elements are $\alpha^5$ and $\alpha^{10}$. Consequently, the binary polynomial representations of $GF(16)$ and $GF(4)$ alone are not sufficient for establishing whether the exact correspondence is $2 \rightarrow 6$ and $3 \rightarrow 7$ or $2 \rightarrow 7$ and $3 \rightarrow 6$. By means, however, of the polynomial representation of $GF(16)$ on $GF(4)$, the correct association is automatic, as illustrated in Table I.

As regards, instead, the substitution of the elements of the generating matrix of $GF(b^{a_i})$ with the corresponding isomorphic element belonging to $GF(b^{a_1 a_2 \cdots a_h})$, this is done using the symbols, in base $b^{a_i}$ and $b^{a_1 a_2 \cdots a_h}$, representing the elements of $GF(b^{a_1 \cdots a_2 a_h})$ isomorphic to the elements of $GF(b^{a_i})$.

In particular, each of the symbols in the base $b^{a_1}$ present in the generating matrix on $GF(b^{a_i})$ is substituted with the corresponding symbol in the base $b^{a_1 a_2 \cdots a_h}$, thus obtaining a multipurpose generating matrix that defines an error-control code that can be used with memory cells the storage levels of which can assume the values of the set $\{b^{a_1}, b^{a_1 a_2}, \ldots, b^{a_1 a_2 \cdots a_h}\}$.

7. Now determine, for each element of the multipurpose generating matrix (representing a corresponding element of $GF(b^{a_1 \cdots a_2 \cdots a_h})$), the number of logic gates required for carrying out the operation of multiplication associated to said element, resorting to the binary polynomial representation (block 90).

8. Abbreviate the multipurpose generating matrix obtained to the value of k initially specified, minimizing the number of elements of $GF(b^{a_1 a_2 \cdots a_h})$ that require the largest number of logic gates (block 100).

In other words, since the generating matrix is $G = [I, P]$ with $\hat{k}$ rows and $\hat{n}$ columns, where I is the matrix identity of dimension $\hat{k}$ whilst P is a matrix $\hat{k} \times (\hat{n} - \hat{k})$, the rows of the matrix P containing elements that require the largest number of logic gates are eliminated, until an abbreviated generating matrix is obtained having a number of rows equal to the value of k specified in Point 1.

9. From the abbreviated multipurpose generating matrix thus obtained it is possible to generate the encoding and decoding circuits in the customary way, described, for example, in the aforementioned *Error-Correcting Codes and Theory and Practice of Error Control Codes*. This matrix always generates a code on $GF(b^{a_1 a_2 \cdots a_h})$: when the cells operate with $b^{a_1}$ levels, the error-control code generated by the abbreviated multipurpose generating matrix is an error-control code on $GF(b^{a_1 a_2 \cdots a_h})$ isomorphic to an error-control code on $GF(b^{a_i})$ that satisfies the initial requirements, whereas when the cells operate with $b^{a_1 \cdots a_i}$ levels and $1<i<h$, the error-control code generated by the abbreviated multipurpose generating matrix is an error-control code on $GF(b^{a_1 \cdots a_2 a_h})$ isomorphic to an error-control code on $GF(b^{a_1 \cdots a_i})$ that satisfies the initial requirements, and so forth (block 110).

Figure 7:
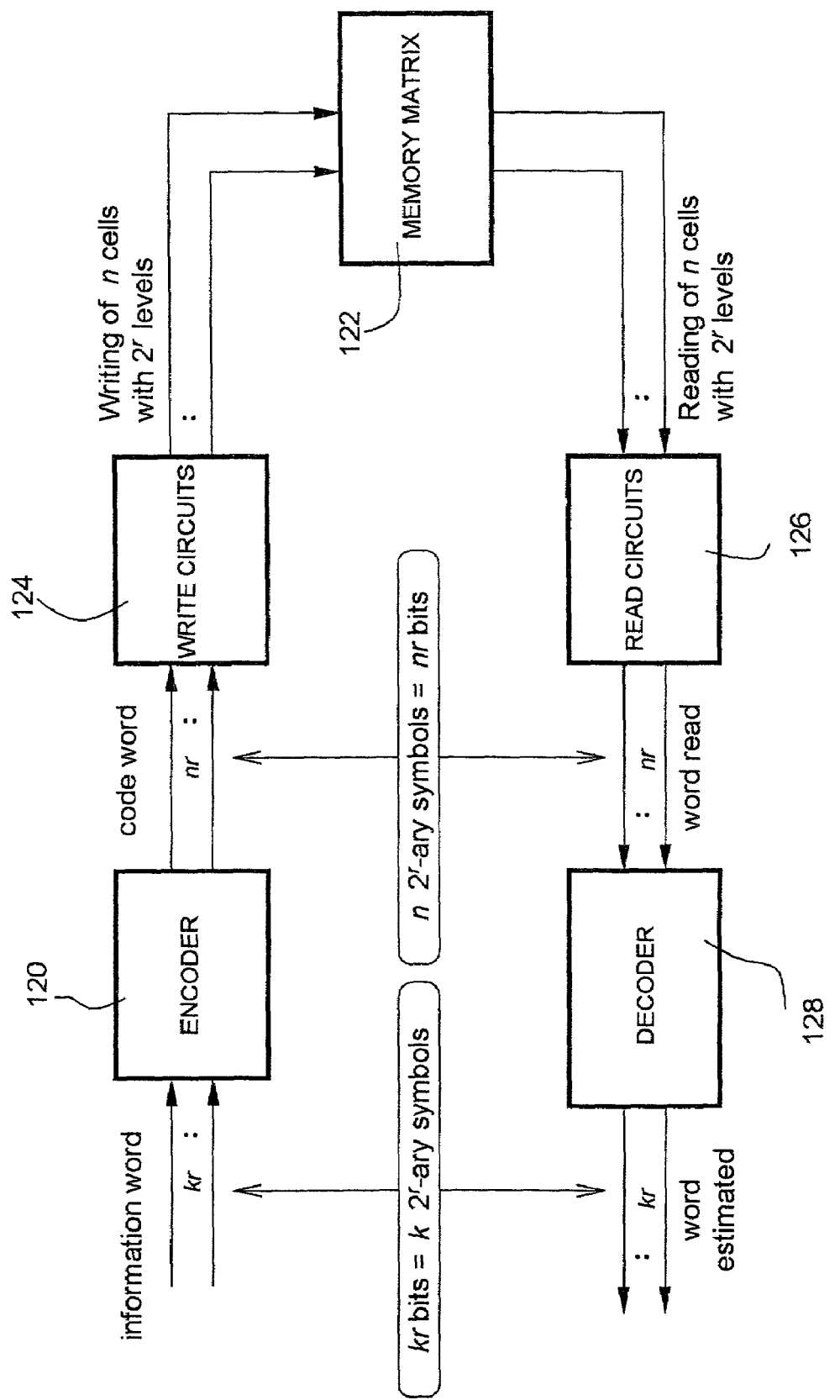
FIG. 7 shows a block diagram representing the encoding, storage and decoding operations of an information word regarding a non-multipurpose error-control code according to the prior art.
Figure 8:
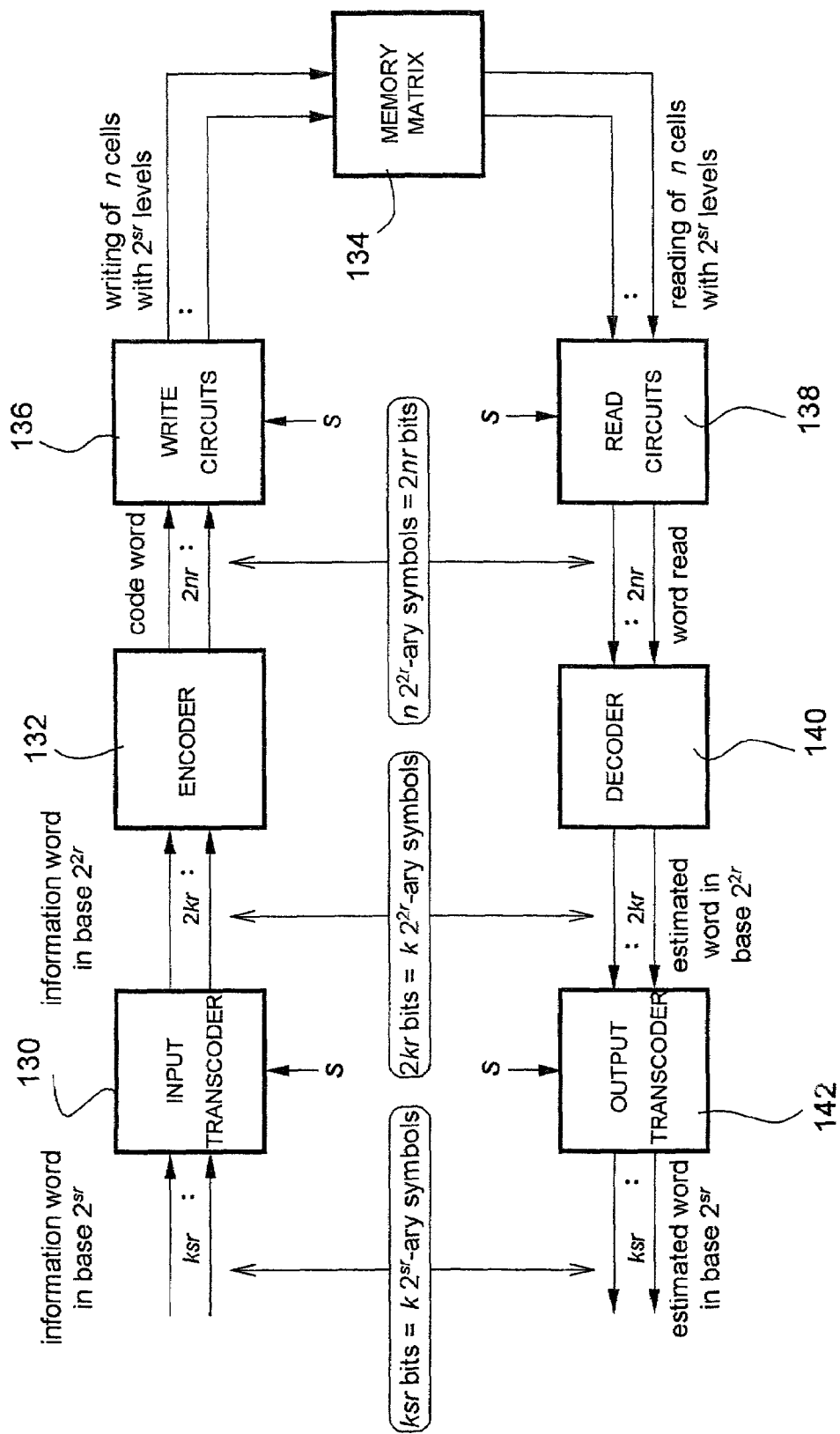
FIG. 8 shows a block diagram representing the encoding, storage and decoding operations of an information word regarding a multipurpose error-control code according to the present invention.

FIGS. 7 and 8 show two block diagrams representing the operations of encoding, storage and decoding of an information word performed using a non-multipurpose error-control code according to the prior art and, respectively, a multipurpose error-control code according to the present invention.

As may be noted from an analysis of FIG. 7, the implementation of a non-multipurpose error-control method according to the prior art operating on memory cells operating only with $2^r$ storage levels (i.e., storing r bits) envisages the use of an encoder 120 that adds, to the k $2^r$-ary symbols of the input information words (n–k), $2^r$-ary symbols for error control. The code words thus obtained are entered into the memory matrix 122, and are read therefrom by means of known write and read circuits 124, 126 that carry out writing and reading of n memory cells with $2^r$ storage levels in one cycle.

The words read are then decoded by a decoder 128 which, on the basis of the n $2^r$-ary symbols of the word read, carries out error control and returns, at output, words of k $2^r$-ary symbols that are the estimation of the original information words.

As may be noted, instead, from a comparison of FIG. 8 with FIG. 7, the implementation of a multipurpose error-control method according to the present invention, operating on memory cells operating with $2^{sr}$ storage levels (for example, with s=1 or s=2 and r fixed, memory cells storing r bits or 2r bits, respectively), envisages the use of an input transcoder 130 that receives at input a control signal S indicating the number of storage levels at which the memory cells operate and then converts, symbol by symbol, groups of sr bits into groups of 2r bits on the basis of given biunique correspondences; i.e., it converts, symbol by symbol, the information words from the base in which they are represented, which is equal to the number of storage levels at which the memory cells operate, to a base equal to the maximum number of storage levels of the memory cells, using the aforesaid biunique correspondences.

An encoder 132 then adds, to the k $2^{2r}$-ary symbols of the input information words (n–k), $2^{2r}$-ary symbols for error control. The code words thus obtained are written into the memory matrix 134 and are read therefrom by means of known writing and reading circuits 136, 138, which receive at input the aforesaid control signal S and carry out writing and reading of n memory cells with $2^{sr}$ storage levels in one cycle.

The words read are then decoded by means of a decoder 140, which, on the basis of the n $2^{2r}$-ary symbols of the word read, carries out error control and returns, at output, words of k $2^{2r}$-ary symbols that are the estimation of the original information words.

Finally, an output transcoder 142, which also receives at input the aforesaid control signal S, converts, symbol by symbol, groups of 2r bits into groups of sr bits, performing the inverse conversion with respect to the input transcoder 120; i.e., it converts, symbol by symbol, the decoded words, from a base equal to the maximum number of storage levels of said memory cells into a base equal to the number of storage levels at which the memory cells operate, using the aforesaid biunique correspondences.

From an examination of the characteristics of the multipurpose method of error-correction obtained according to the present invention the advantages afforded thereby emerge clearly.

In particular, the error-control code constructed in the way described above presents the capacity of controlling error in multilevel memory cells operating with a variable number of storage levels, using the same circuit blocks.

In addition, the error-control code constructed in the way described above presents the maximum level of reliability in every operating mode and enables a better exploitation of the memory cells used for the control, whilst the additional area required on the silicon is minimal and there is practically no additional delay time.

Finally, it is clear that modifications and variations can be made to the method of construction and to the multipurpose error-control method described and illustrated herein, without thereby departing from the sphere of protection of the present invention, as defined in the attached claims.

We claim:

1. An error control method for multilevel memory cells operating with a variable number of storage levels, the method comprising:
   receiving a first information word having k input symbols each in a first base, the first base being equal to the number of storage levels at which the memory cells are operating;
   converting the first information word into a second base by converting the input symbols into input symbols in the second base, the second base being equal to a maximum number of storage levels in the memory cells;
   encoding the converted first information word into a first codeword having k+n coded symbols in the second base;
   writing the first codeword into the multilevel memory cells.

2. The error control method of claim 1, further comprising:
   receiving a second information word having k input symbols each in the second base;
   encoding the second information word into a second codeword having k+n coded symbols in the second base;
   writing the second codeword into the multilevel memory cells.

3. The error control method of claim 1, further comprising:
   reading from the multilevel memory cells the first codeword;
   decoding the first codeword into an estimated word having k estimated symbols in the second base; and
   converting the estimated word into the first base by converting the estimated symbols into estimated symbols in the first base.

4. The method of claim 1 wherein the storage levels of the memory cells can assume values of the set $\{b^{a_1}b^{a_1 a_2}, \ldots, b^{a_1 a_2 \cdots a_h}\}$; wherein $b^{a_1}$, $b^{a_1 a_2}$, ..., $b^{a_1 a_2 \cdots a_h}$ are bases expressed as a base value b and polynomial degrees $a_1$, $a_2$, ..., $a_h$, the first information word is formed by k q-ary symbols belonging to an alphabet containing q different symbols, with $q \in \{b^{a_1}b^{a_1 a_2}, \ldots, b^{a_1 a_2 \cdots a_i}\}$, the first codeword is formed by k+n q-ary symbols, with $q = b^{a_1 a_2 \cdots a_h}$, and having an error-correction capacity t, and the encoding step includes generating the first codeword through an operation of multiplication between the first information word and a generating matrix, the encoding step further comprising:

acquiring values of k, t, $b^{a_1}, b^{a_1 a_2}, \ldots, b^{a_1 a_2 \cdots a_h}$, of said first codeword;

calculating, as a function of $q=b^{a_1}$, k and t, the minimum value of n such that a Hamming limit is satisfied;

calculating the maximum values and $\hat{n}$ and $\hat{k}$ of n and $^1k$ that satisfy said Hamming limit for $q=b^{a_1}$, t and $(\hat{n}-\hat{k})=(n-k)$;

determining, as a function of t, the generating matrix of the first codeword $(\hat{n}, \hat{k})$ on a finite-element field $GF(b^{a_1})$;

constructing binary polynomial representations of finite-element fields $GF(b^{a_1}), GF(b^{a_1 a_2}), \ldots, GF(b^{a_1 a_2 \cdots a_h})$, identifying, using said binary polynomial representations, elements of the finite-element field $GF(b^{a_1 a_2 \cdots, a_h})$ isomorphic to elements of the finite-element fields $GF(b^{a_1} GF((b^{a_1 a_2}), \ldots, GF(b^{a_1 a_2 \cdots h-1}))$;

establishing biunique correspondences between the elements of the finite-element fields $(GF(b^{a_1}), (GF(b^{a_{12}}), \ldots, (GF(b^{a_1 a_2 \cdots a_{h-1}}))$, and the elements of the finite-element field $GF(b^{a_1 a_2 \cdots a_h})$ that are isomorphic to them; and substituting each of a plurality of elements of said generating matrix with a corresponding isomorphic element of the finite-element field $(GF(b^{a_1 a_2 \cdots a_h})$, thus obtaining a multipurpose generating matrix defining, together with said biunique correspondences, said first codeword.

5. The method of claim 4, in which said first codeword is a linear block code.

6. The method of claim 4, in which the identification of the elements of the finite-element field $(GF(b^{a_1 a_2 \cdots a_1})$, isomorphic to the elements of the finite-element fields $(GF(b^{a_1}), (GF(b^{a_{12}}), \ldots, (GF(b^{a_1 a_2 \cdots a_{h-1}}))$, is performed on the basis of the multiplicity of said elements in the finite-element field $(GF(b^{a_1 a_2 \cdots a_{h-1}}))$.

7. The method of claim 6, in which said step of identifying the elements of the finite-element field $(GF(b^{a_{12} \cdots a_h})$ isomorphic to the elements of the finite-element fields $(GF(b^{a_1}), (GF(b^{a_{12}}), \ldots, (GF(b^{a_1 a_2 \cdots a_h})$, comprises the step of identifying the elements of the finite-element field $(GF(b^{a_{12} \cdots a_h})$ that have respectively multiplicity being equal to, or being a function of, $b^{a_1}, b^{a_1 a_2}, \ldots, b^{a_1 a_2 \cdots a_{h-1}}$.

8. The method of claim 4, in which said step of establishing biunique correspondences between the elements of the finite-element fields $(GF(b^{a_1}), (GF(b^{a_{12}}), \ldots, (GF(b^{a_1 a_2 \cdots a_{h-1}}))$, and the elements of the finite-element field $(GF(b^{a_1 a_2 \cdots a_h})$, isomorphic to them comprises the steps of:

constructing binary polynomial representations of the finite-element fields $(GF(b^{a_1}), (GF(b^{a_{12}}), \ldots, (GF(b^{a_1 a_2 \cdots a}))$; and establishing biunique correspondences between the elements of the finite-element fields $(GF(b^{a_1}), (GF(b^{a_{12}}), \ldots, (GF(b^{a_1 a_2 \cdots a})$ and the elements of the finite-element field $(GF(b^{a_{12} \cdots a_h})$ isomorphic to them, using said binary polynomial representations.

9. The method of claim 8, in which said binary polynomial representations of the finite-element fields $(GF(b^{a_1}), (GF(b^{a_{12}}), \ldots, (GF(b^{a_1 a_2 \cdots a_h}))$, are constructed using respective primitive polynomials of a degree respectively equal to $a_1, a_1 a_2, \ldots, a_{1 a 2} \ldots a_h$ on the finite-element field $GF(2)$, said binary polynomial representations associating, to each element of the respective finite-element fields $(GF(b^{a_1}), (GF(b^{a_{12}}), \ldots, (GF(b^{a_1 a_2 \cdots a_h}))$, a corresponding binary polynomial of degree respectively less than $a_1, a_2, \ldots, a_1 a_2 \ldots a_h$.

10. The method of claim 9, in which said step of establishing biunique correspondences between elements of the finite-element field $(GF(b^{a_1 a_2 \cdots a_h})$, and the elements of the finite-element fields $(GF(b^{a_1}), (GF(b^{a_{12}}), \ldots, (GF(b^{a_1 a_2 \cdots a_h}))$, isomorphic to them comprises the steps of:

for each element of the finite-element field $(GF(b^{a_1 a_2 \cdots a_h})$, isomorphic with a corresponding element of one of the finite-element fields $(GF(b^{a_1}), (GF(b^{a_{12}}), \ldots, (GF(b^{a_1 a_2 \cdots a_{h-1}}))$, forming a first binary word with the coefficients of the terms of the binary polynomial associated to said element of $(GF(b^{a_{12} \cdots a_h})$ and a second binary word with the coefficients of the terms of the binary polynomial associated to said corresponding element of one of the finite-element fields $(GF(b^{a_1}), (GF(b^{a_{12}}), \ldots, (GF(b^{a_1 a_2 \cdots a_{h-1}}))$;

converting said first binary word into the base $b^{a_1 a_2 \cdots a_h}$, thus obtaining a first symbol, and said second binary word into the base of the finite-element field to which said corresponding element belongs, thus obtaining a second symbol; said first symbol and said second symbol defining the biunique correspondence between said element of the finite-element field $(GF(b^{a_1 a_2 \cdots a_h})$, and the corresponding element of one of the finite-element fields $(GF(b^{a_1}), (GF(b^{a_{12}}), \ldots, (GF(b^{a_1 a_2 \cdots a_{h-1}}))$ isomorphic to it.

11. The method of claim 4, comprising:

determining, for each element of the multipurpose generating matrix, the number of logic gates necessary for carrying out the operation of multiplication associated with said element; and abbreviating said multipurpose generating matrix to the value of k initially specified, thus minimizing the number of elements of the finite-element field $(GF(b^{a_1 a_2 \cdots a_h})$ that require the largest number of logic gates.

12. The method of claim 11, in which said step of determining the number of logic gates is performed using said binary polynomial representation of the finite-element field $(GF(b^{a_1 a_2 \cdots a_h}))$.

13. The method of claim 1 wherein the encoding step includes generating the first codeword through an operation of multiplication between the first information word and a generating matrix, the method further comprising:

decoding a word read in said memory, using said first codeword; and converting, symbol by symbol, said decoded word from the second base to the first base.

14. An error control method for multilevel memory cells operating with a variable number of storage levels, the method comprising:

reading from the multilevel memory cells a codeword having k+n coded symbols in a first base the first base being equal to a maximum number of storage levels of the memory levels;

decoding the codeword into an estimated word having k estimated symbols in the first base; and converting the estimated word into a second base by converting the estimated symbols into estimated symbols in the second base, second base being equal to the number of storage levels at which the memory cells are operating.

15. The method of claim 14, the method further comprising:

converting an information word, having k input symbols each in the second base, into the first base by converting the input symbols into input symbols in the first base; and generating the codeword by multiplying a generating matrix by the information word in the first base; and writing the codeword into the multilevel memory cells.

16. A computer storage device, comprising:
- a memory matrix that includes multilevel memory cells capable of storing data in a first base or a second base, the first base being equal to a number of storage levels at which the memory cells are operating, the second base being equal to a maximum number of storage levels of the memory cells;
- an input transcoder having a word input that receives an information word having k input symbols each in the first base, a control input that receives a control signal indicating whether the memory matrix is operating according to the first base or the second base, and an output that outputs a converted information word in the second base;
- an encoder coupled to the output of the input transcoder and structured to encode the converted information word into a codeword having k+n coded symbols in the second base;
- a write circuit having an input coupled to the encoder and an output coupled to the memory matrix, the write circuit being structured to writ the codeword into the memory matrix.

17. The computer storage device of claim 16, further comprising:
- a read circuit coupled to the memory matrix and structured to read the codeword from the memory matrix;
- a decoder coupled to the read circuit and structured to decode the codeword into an estimated word having k estimated symbols in the second base; and
- an output transcoder coupled to the decoder and structured to convert the estimated word into the first base by converting the estimated symbols into estimated symbols in the first base.

18. A computer storage device, comprising:
- a memory matrix of multilevel memory cells operating with a variable number of storage levels;
- means for receiving a first information word having k input symbols each in a first base, the first base being equal to the number of storage levels at which the memory cells are operating;
- means for converting the first information word into a second base by converting the input symbols into input symbols in the second base, the second base being equal to a maximum number of storage levels of the memory cells;
- means for encoding the converted first information word into a first codeword having k+n coded symbols in the second base;
- means for writing the first codeword into the multilevel memory cells.

19. The device of claim 18, further comprising:
means for receiving a second information word having k input symbols each in the second base; wherein the encoding means includes means for encoding the second information word into a second codeword having k+n coded symbols in the second base, and the writing means includes means for writing the second codeword into the multilevel memory cells.

20. The device of claim 18, further comprising:
- means for reading from the multilevel memory cells the first codeword;
- means for decoding the first codeword into an estimated word having k estimated symbols in the second base; and
- means for converting the estimated word into the first base by converting the estimated symbols into estimated symbols in the first base.

* * * * *

UNITED STATES PATENT AND TRADEMARK OFFICE
CERTIFICATE OF CORRECTION

PATENT NO. : 7,047,478 B2
APPLICATION NO. : 10/015949
DATED : May 16, 2006
INVENTOR(S) : Stefano Gregori et al.

It is certified that error appears in the above-identified patent and that said Letters Patent is hereby corrected as shown below:

Column 17

Line 15, "isomorphie" should be -- isomorphic --.

Line 16, "$GF(b^{a_1}GF((b^{a_1 a_2}),...,GF(b^{a_1 a_2 ... a_{k-1}}))$" should be -- $GF(b^{a_1}), GF(b^{a_1 a_2}), ..., GF(b^{a_1 a_2 ... a_{k-1}})$ --

Lines 18-19, "$GF(b^{a_1}), (GF(b^{a_{12}}),..., (GF(b^{a_1 a_2 ... a_{k-1}}),$" should be -- $GF(b^{a_1}), GF(b^{a_1 a_2}), ..., GF(b^{a_1 a_2 ... a_{k-1}})$ --

Line 24, "$(GF(b^{a_1 a_2 ... a_k}))$" should be -- $GF(b^{a_1 a_2 ... a_k})$ --

Line 31, "$(GF(b^{a_1 a_2 ... a_1})),$" should be -- $GF(b^{a_1 a_2 ... a_k})$ --

Line 33, "$(GF(b^{a_1}), (GF(b^{a_{12}}),..., (GF(b^{a_1 a_2 ... a_{k-1}})),$" should be -- $GF(b^{a_1}), GF(b^{a_1 a_2}), ..., GF(b^{a_1 a_2 ... a_{k-1}})$ --

Line 35, "$(GF(b^{a_1 a_2 ... a_{k-1}}))$" should be -- $GF(b^{a_1 a_2 ... a_{k-1}})$ --

Line 37, "$(GF(b^{a_{12} ... a_k}))$" should be -- $GF(b^{a_1 a_2 ... a_k})$ --

Line 39, "$(GF(b^{a_1}), (GF(b^{a_{12}}),..., (GF(b^{a_1 a_2 ... a_k})),$" should be -- $GF(b^{a_1}), GF(b^{a_1 a_2}), ..., GF(b^{a_1 a_2 ... a_{k-1}})$ --

Lines 40-41, "$(GF(b^{a_{12} ... a_k}))$" should be -- $GF(b^{a_1 a_2 ... a_k})$ --

Lines 45-46, "$(GF(b^{a_1}), (GF(b^{a_{12}}),..., (GF(b^{a_1 a_2 ... a_{k-1}})),$" should be -- $GF(b^{a_1}), GF(b^{a_1 a_2}), ..., GF(b^{a_1 a_2 ... a_{k-1}})$ --

Line 47, "$(GF(b^{a_1 a_2 ... a_k}))$" should be -- $GF(b^{a_1 a_2 ... a_k})$ --

Lines 49-50, "$(GF(b^{a_1}), (GF(b^{a_{12}}),..., (GF(b^{a_1 a_2 ... a}))$" should be -- $GF(b^{a_1}), GF(b^{a_1 a_2}), ..., GF(b^{a_1 a_2 ... a_k})$ --

Lines 52-53, "$(GF(b^{a_1}), (GF(b^{a_{12}}),..., (GF(b^{a_1 a_2 ... a})$" should be -- $GF(b^{a_1}), GF(b^{a_1 a_2}), ..., GF(b^{a_1 a_2 ... a_{k-1}})$ --

Line 54, "$(GF(b^{a_{12} ... a_k}))$" should be -- $GF(b^{a_1 a_2 ... a_k})$ --

UNITED STATES PATENT AND TRADEMARK OFFICE
CERTIFICATE OF CORRECTION

PATENT NO. : 7,047,478 B2
APPLICATION NO. : 10/015949
DATED : May 16, 2006
INVENTOR(S) : Stefano Gregori et al.

It is certified that error appears in the above-identified patent and that said Letters Patent is hereby corrected as shown below:

Lines 57-58, "$(GF(b^{a_1}),(GF(b^{a_{12}}),...,(GF(b^{a_1 a_2 \cdots a_h}))$" should be -- $GF(b^{a_1}), GF(b^{a_1 a_2}),..., GF(b^{a_1 a_2 \cdots a_h})$ --

Line 60, "$a_1, a_1 a_2, \ldots, a_{1a2} \ldots a_h$" should be -- $a_1, a_1 a_2, \ldots, a_1 a_2 \ldots a_h$ --

Lines 62-63, "$(GF(b^{a_1}),(GF(b^{a_{12}}),...,(GF(b^{a_1 a_2 \cdots a_h}))$" should be -- $GF(b^{a_1}), GF(b^{a_1 a_2}),..., GF(b^{a_1 a_2 \cdots a_h})$ --

Lines 64-65, "$a_1, a_2, \ldots, a_1 a_2 \ldots a_h$" should be -- $a_1, a_1 a_2, \ldots, a_1 a_2 \ldots a_h$ --

Column 18

Line 1, "$(GF(b^{a_1 a_2 \cdots a_h}),$" should be -- $GF(b^{a_1 a_2 \cdots a_h})$ --

Lines 2-3, "$(GF(b^{a_1}),(GF(b^{a_{12}}),...,(GF(b^{a_1 a_2 \cdots a_h})),$" should be -- $GF(b^{a_1}), GF(b^{a_1 a_2}),..., GF(b^{a_1 a_2 \cdots a_{h-1}})$ --

Line 5, "$(GF(b^{a_1 a_2 \cdots a_h}),$" should be -- $GF(b^{a_1 a_2 \cdots a_h})$ --

Lines 6-7, "$(GF(b^{a_1}),(GF(b^{a_{12}}),...,(GF(b^{a_1 a_2 \cdots a_{h-1}}))$" should be -- $GF(b^{a_1}), GF(b^{a_1 a_2}),..., GF(b^{a_1 a_2 \cdots a_{h-1}})$ --

Line 9, "$(GF(b^{a_{12} \cdots a_h}))$" should be -- $GF(b^{a_1 a_2 \cdots a_h})$, --

Line 13, "$(GF(b^{a_1}),(GF(b^{a_{12}}),...,(GF(b^{a_1 a_2 \cdots a_{h-1}}))$" should be -- $GF(b^{a_1}), GF(b^{a_1 a_2}),..., GF(b^{a_1 a_2 \cdots a_{h-1}})$ --

Line 20, "$(GF(b^{a_1 a_2 \cdots a_h}),$" should be -- $GF(b^{a_1 a_2 \cdots a_h})$ --

Line 22, "$(GF(b^{a_1}),(GF(b^{a_{12}}),...,(GF(b^{a_1 a_2 \cdots a_{h-1}}))$" should be -- $GF(b^{a_1}), GF(b^{a_1 a_2}),..., GF(b^{a_1 a_2 \cdots a_{h-1}})$ --

Line 32, "$(GF(b^{a_1 a_2 \cdots a_h}))$" should be -- $GF(b^{a_1 a_2 \cdots a_h})$ --

Line 37, "$(GF(b^{a_1 a_2 \cdots a_h}))$" should be -- $GF(b^{a_1 a_2 \cdots a_h})$ --

UNITED STATES PATENT AND TRADEMARK OFFICE
CERTIFICATE OF CORRECTION

| | |
|---|---|
| PATENT NO. | : 7,047,478 B2 |
| APPLICATION NO. | : 10/015949 |
| DATED | : May 16, 2006 |
| INVENTOR(S) | : Stefano Gregori et al. |

It is certified that error appears in the above-identified patent and that said Letters Patent is hereby corrected as shown below:

Lines 51-54, "reading from the multilevel memory cells a codeword having k+n coded symbols in a first base the first base being equal to a maximum number of storage levels of the memory levels;" should read as -- reading from the multilevel memory cells a codeword having k+n coded symbols in a first base, the first base being equal to a maximum number of storage levels of the memory cells; --

Signed and Sealed this

Twenty-second Day of July, 2008

JON W. DUDAS
*Director of the United States Patent and Trademark Office*